United States Patent [19]

Ohba

[11] Patent Number: 5,075,711

[45] Date of Patent: Dec. 24, 1991

[54] METHOD OF AND APPARATUS FOR DEVELOPING PHOTOSENSITIVE LITHOGRAPHIC PLATE

[75] Inventor: Hisao Ohba, Shizuoka, Japan

[73] Assignee: Fuji Photo Film Co., Ltd., Kanagawa, Japan

[21] Appl. No.: 391,909

[22] Filed: Aug. 10, 1989

[30] Foreign Application Priority Data

Aug. 16, 1988 [JP] Japan ................................. 63-203403

[51] Int. Cl.⁵ ............................ G03B 3/06; G03B 3/08
[52] U.S. Cl. .................................... 354/320; 354/325; 15/77; 15/102
[58] Field of Search ................ 354/317, 320, 321, 322, 354/324, 325; 15/77, 100, 102

[56] References Cited

U.S. PATENT DOCUMENTS

| | | | |
|---|---|---|---|
| 3,589,261 | 6/1971 | Krikelis | 354/325 X |
| 4,148,576 | 4/1979 | Matino | 354/320 |
| 4,464,035 | 8/1984 | Schoering | 354/325 X |
| 4,841,320 | 6/1989 | Takekoshi et al. | 354/317 X |

FOREIGN PATENT DOCUMENTS 63-158548 7/1988 Japan .
1-177541 7/1989 Japan .

Primary Examiner—A. A. Mathews
Attorney, Agent, or Firm—Sughrue, Mion, Zinn Macpeak & Seas

[57] ABSTRACT

A method of and an apparatus for developing with a developer a photosensitive lithographic plate on which images have been exposed while transporting the photosensitive lithographic plate with one surface thereof facing roughly downwards. In the method and the apparatus, while the photosensitive lithographic plate coated with the developer is being transported in a transport path which accommodates a portion of the developer and which is curved in a downward projecting manner, the photosensitive lithographic plate is dipped in the accommodated developer and, at the same time, the development of the layers of the photosensitive lithographic plate is accelerated by rubbing them. Moreover, the developer in the transport path is replenished with the developer which has been applied to the photosensitive lithographic plate. Accordingly, it is not necessary to provide a developer replenishing device in the transport path.

18 Claims, 3 Drawing Sheets

METHOD OF AND APPARATUS FOR DEVELOPING PHOTOSENSITIVE LITHOGRAPHIC PLATE

BACKGROUND OF THE INVENTION

1. Field of the Invention

The present invention relates to a method of and an apparatus for developing a photosensitive lithoghraphic plate (hereinafter called "PS plate" as required) on which an image is has been exposed.

2. Description of the Related Art

A photosensitive lithographic plate on which an image has been exposed is transported to a photosensitive-lithographic-plate developing apparatus for the purpose of development.

This development is carried out by utilizing a dip method or a horizontal transport spray development method in which a photosensitive lithographic plate is transported to a development tank which accommodates a developer and is then dipped into the developer for development purposes or by utilizing a metering method in which development is effected by coating light sensitive layers of a photosensitive lithographic plate with a predetermined amount of developer which is substantially fresh.

However, in the case of the aforesaid dip method, since a photosensitive lithographic plate needs to be dipped, a large amount of developer must be charged. Moreover, while a number of plates are being developed, the developer gradually deteriorates. Accordingly, the developer which has deteriorated must be replenished with a fresh developer, so that a large amount of developer will be needed. In addition, a device for supplying the replenisher, piping, etc. are needed for the purpose of replenishment, thus the entire apparatus becomes complicated. Furthermore, the developer must be circulated in order to keep uniform the concentration of the developer, and this also leads to the problem of the apparatus being complicated. In some cases, in order to replace a developer which is being used with a fresh developer, some developer may be discarded even though it is still usable. For this reason, it has been impossible to effectively use the developer without any waste.

In the horizontal transport spray development method, since the developer must be circulated, the entire apparatus becomes likewise complicated.

On the other hand, in the case of the metering method, development is always carried out with a fresh developer which has not yet been used. Accordingly, since neither a device for supplying a replenisher for the developer nor a device for circulating the replenisher is needed, the apparatus is simple compared to the apparatus used in the dip method or the horizontal transport spray development method described above.

In the aforesaid metering method, however, when a photosensitive lithographic plate is to be vertically transported in case the plate has light sensitive layers on both side thereof, the PS plate which is transported in the approximately horizontal direction must be turned in the approximately vertical direction. Accordingly, there is a disadvantage in that a guide/transport roller or the like is needed. For this reason, it has been proposed to develop the PS plate while transporting it in the horizontal direction.

However, if the both light sensitive layers of a photosensitive lithographic plate are to be coated with a developer while the plate is being transported in the approximately horizontal direction, the following problem will be encountered. If the surface of the photosensitive lithographic plate on which an image has been exposed faces up, the developer is retained on the surface without being dropped, but if the image-printed surface faces down, the developer will naturally drop. Accordingly, it is impossible to develop the lower surface and it is therefore impossible to reliably develop both the upper and lower surfaces of the photosensitive lithographic plate.

SUMMARY OF THE INVENTION

It is therefore an object of the present invention to provide a method of and an apparatus for developing a photosensitive lithographic plate, both of which are capable of reliably developing both the upper and lower surfaces of the photosensitive lithographic plate with the minimum required amount of developer.

To achieve the above object, in accordance with the present invention, there is provided an improved method of developing a photosensitive lithographic plate on which an image has been exposed as well as an improved apparatus for carrying out such a method. In the method and the apparatus, while the photosensitive lithographic plate is being transported in the approximately horizontal direction, the upper and lower surfaces of the photosensitive lithographic plate are coated with a predetermined amount of developer. Thereafter, the photosensitive lithographic plate which has been coated with the developer is transported in the obliquely downward direction and dipped into a developer. In the developer, the upper and lower surfaces of the photosensitive lithographic plate are rubbed with a rubbing means so that the development is effected.

In accordance with the present invention provided with the above-described arrangement and construction, the photosensitive lithographic plate having a printed image is transported in the approximately horizontal direction while the upper and lower surfaces thereof are being coated with a predetermined amount of developer. The supply rate of a developing apparatus preferably ranges between 5 $cc/m^2$ and 300 $cc/m^2$, more preferably between 20 $cc/m^2$ and 200 $cc/m^2$. It is preferable to employ a developer of the type in which, as disclosed in Japanese Patent Application Serial No. 1701/1988, the viscosity of the developer ranges between 25° C. cps and 10,000 cps and also of the type which is 50 dyne/cm or below at 25° C. as disclosed in Japanese Patent Application Serial No. 307055/1986. The method of coating a predetermined amount of developer may be carried out by utilizing a spray wire bar, a roller, a gravure roller, a curtain coater, or a method of dropping a developer from a nozzle capable of travelling rightward and leftward. The photosensitive lithographic plate coated with the predetermined amount of developer is transported in the obliquely downward direction and dipped in the developer. In the developer, the upper and lower surfaces of photosensitive lithographic plates are rubbed with the rubbing means so that the development is effected.

The rubbing means preferably utilizes a rubbing member having raised nap, and the material may be selected from among materials of the type which do not scratch the printing surfaces of the photosensitive lithographic plate, such as nylon, polyester, pig's fur, horse's fur and the like. The rubbing member may be arranged to rub the photosensitive lithographic plate perpendicularly to the direction in which it is transported.

As described above, in accordance with the present invention, after the upper and lower surfaces of the photosensitive lithographic plate are coated with the developer by the minimum required amount which corresponds to a predetermined amount, the photosensitive lithographic plate is dipped into the developer and, at the same time, the upper and lower surfaces of the photosensitive lithographic plate are rubbed in this developer. Accordingly, the development of the upper and lower surfaces is accelerated and they can be reliably developed.

In accordance with one aspect of the present invention, there is provided an improved method of developing with a developer a photosensitive lithographic plate on which an image has been exposed while transporting the photosensitive lithographic plate with one surface thereof facing roughly downwards. The improve method comprises the steps of coating light sensitive layers of the photosensitive lithographic plate with a developer; dipping the photosensitive lithographic plate coated with the developer into the developer while curving the photosensitive lithographic plate downwards and, at the same time, replenishing the developer in which the photosensitive lithographic plate is dipped with the developer applied to the photosensitive lithographic plate, and accelerating development by rubbing the light sensitive layers of the photosensitive lithographic plate while the photosensitive lithographic plate is being dipped in the developer.

In the above-described arrangement and construction, the photosensitive lithographic plate coated with the developer is dipped into the developer in a curved state, and the printing surfaces are rubbed in the dipped state so that the development is accelerated. In addition, the developer in which photosensitive lithographic plates are to be dipped is replenished with the developer applied to the photosensitive lithographic plate.

In accordance with another aspect of the present invention, there is provided an improved apparatus for developing a photosensitive lithographic plate on which an image has been exposed while transporting the photosensitive lithographic plate with one surface thereof facing roughly downwards. The improved apparatus is provided with coating means for coating with a developer light sensitive layers of the photosensitive lithographic plate which is being transported, a developing section which accommodates the developer in which the photosensitive lithographic plate coated with the developer is to be dipped as the photosensitive lithographic plate is curved to project downwards, the developing section being arranged such that the developer applied to the photosensitive lithographic plate is carried into the developing section to replenish the developer in the developing section with the developer applied to the photosensitive lithographic plate, and rubbing means disposed in the developing section for accelerating development by rubbing at least the light sensitive layers of the photosensitive lithographic plate.

In the above-described arrangement and construction, the photosensitive lithographic plate coated with the developer is dipped into the developer accommodated in the developing section in a curved state therein and, at the same time, the developer applied to the photosensitive lithographic plate is carried into the developing section. The development of the photosensitive lithographic plate is accelerated by rubbing it by the rubbing member disposed in the developing section. In this manner, the development of the photosensitive lithographic plate is accelerated by means of the rubbing means and, at the same time, the developer in the developing section is replenished with the developer which has been applied to the photosensitive lithographic plate and carried into the developing section. Accordingly, it is not necessary to provide a replenishing device for replenishment of the developer in the developing section.

DESCRIPTION OF THE PREFERRED EMBODIMENT

Figure 1:
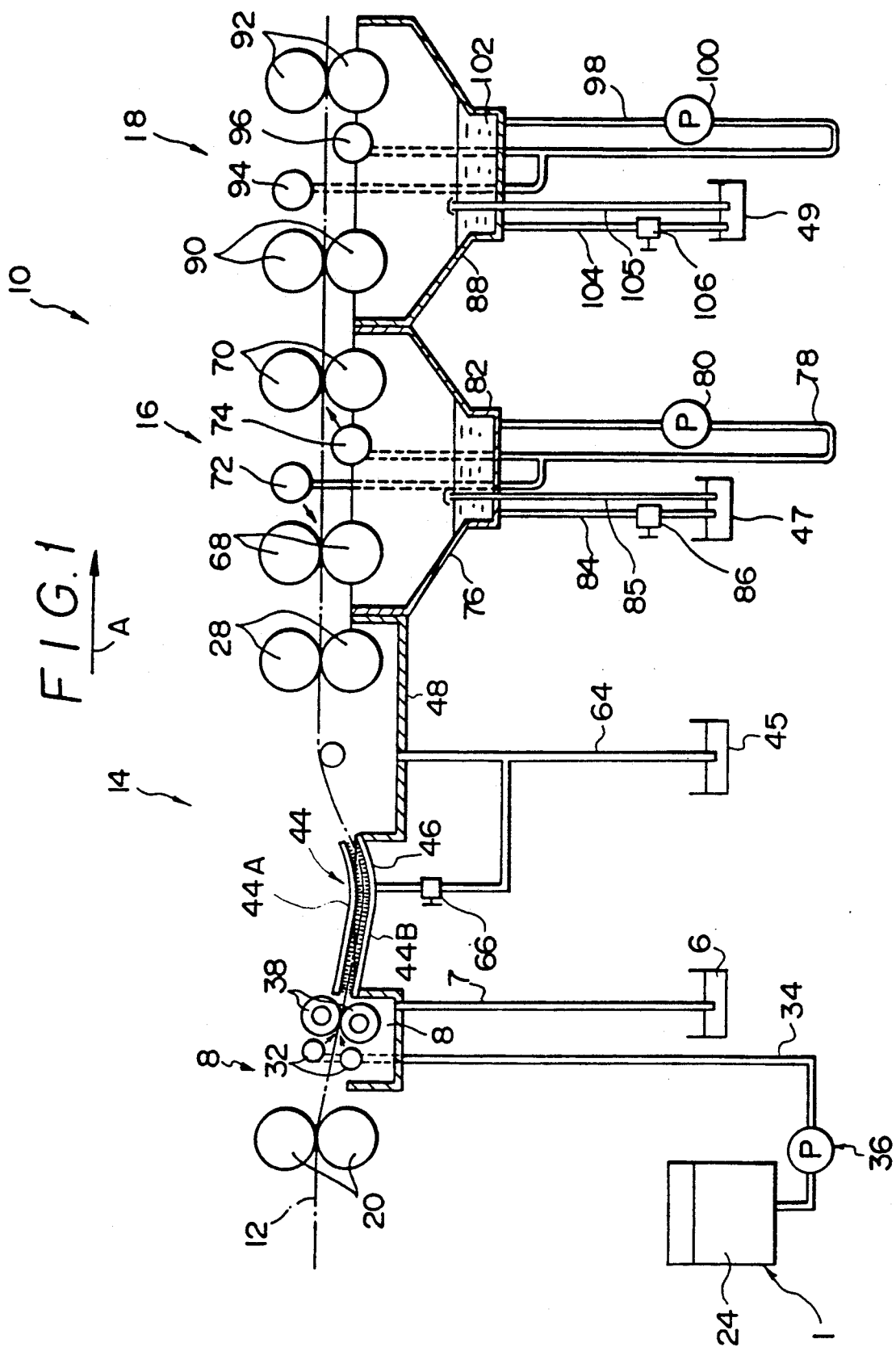
FIG. 1 is a diagrammatic view showing a photosensitive-lithographic-plate processor to which an embodiment of the present invention is applied.

FIG. 1 shows a photosensitive-lithographic-plate processor 10 to which an embodiment of the present invention is applied.

The photosensitive-lithographic-plate processor 10 comprises a coating section 8 for applying a coat of the minimum required amount of developer to each of the light sensitive layers of photosensitive lithographic (PS) plate 12, on which images are exposed by a printing apparatus (not shown), a developing section 14 for developing the PS plate 12, a washing section 16 for washing the developed PS plate 12, and a desensitizing section 18 for applying a desensitizing liquid to the PS plate 12. The developing section 14, the washing section 16 and the desensitizing section 18 are arranged in that order, and the PS plate 12 is processed while it is being transported in the approximately horizontal direction.

As shown in FIG. 1, a pair of transport rollers 20 is disposed on the side on which the PS plate 12 is inserted into a developer metering tank 8. The PS plate 12, on which images are exposed by the printing apparatus (not shown), is arranged to be inserted into the gap between this pair of transport rollers 20.

The PS plate 12 is fed in the obliquely downward direction by means of this transport roller pair 20 and transported to the developer metering tank 8. This developer metering tank 8 includes a pair of spray pipes 32 and a pair of wire bars 38, each pair consisting of two elements which are arranged generally vertically, one being located above a transport path for the PS plate 12 and the other therebelow.

A plurality of developer delivery ports (not shown) are formed in each of the spray pipes 32 along the longitudinal axis thereof.

The spray pipes 32 are arranged to communicate with a line 34 which communicates with the bottom of a developer tank 1. A developer supplying pump 36 is disposed at an intermediate position on the line 34, and a developer 24 is supplied to the spray pipes 32 by the operation of the developer supplying pump 36. The developer tank 1 may be provided with a concentration adjusting device or an agitator as required. As the developer 24 in the developer tank 1 decreases, additional developer 24 is supplied to the developer tank 1 from a developer supplying device (not shown). The developer 24 thus supplied is delivered from the respective developer delivery ports to the upper and lower surfaces of the PS plate 12.

When the developer 24 is supplied to the upper and lower surfaces of the PS plate 12, an extra portion of the developer 24 is removed by the wire bars 38 so that only the amount required to develop the PS plate 12 is left. In this manner, the developer is metered.

One end of a line 7 communicates with the bottom of the developer tank 1, and the other end of the line 7 is opened in a developer recovery tank 6.

Figure 2:
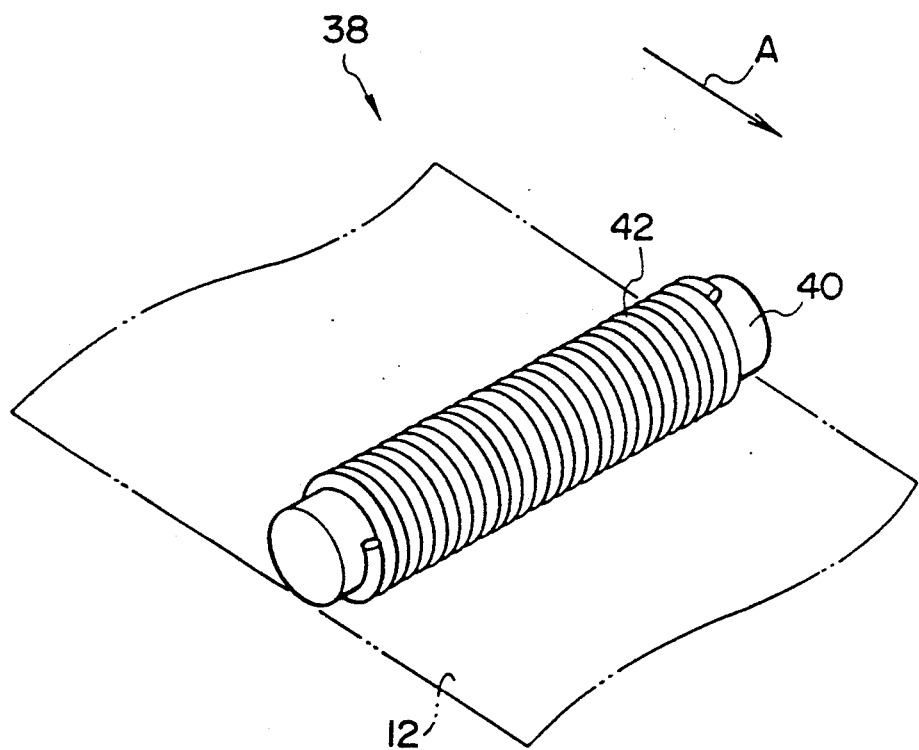
FIG. 2 is a perspective view showing a wire bar for use in the embodiment.

As shown in FIG. 2, each of the wire bars 38 consists essentially of a shaft 40 and a wire spirally wound around the outer periphery of the shaft 40. It is preferable that the wire 42 have a diameter of about 0.1 mm to about 3 mm. These spirally wound wires 42 are spaced apart from each other at a predetermined interval so that they can abut against the upper and lower surfaces of the PS plate 12, respectively.

In a manner similar to those of a transport roller pair 26, a transport roller pair 28 and a roller 30, the wire bars 38 are rotatably supported between a pair of side boards (not shown) so as to be rotated by the driving force of a driving means (not shown)

The PS plate which has been coated with a predetermined amount of developer is transported in the obliquely downward direction and fed into the developing section 14.

Figure 3:
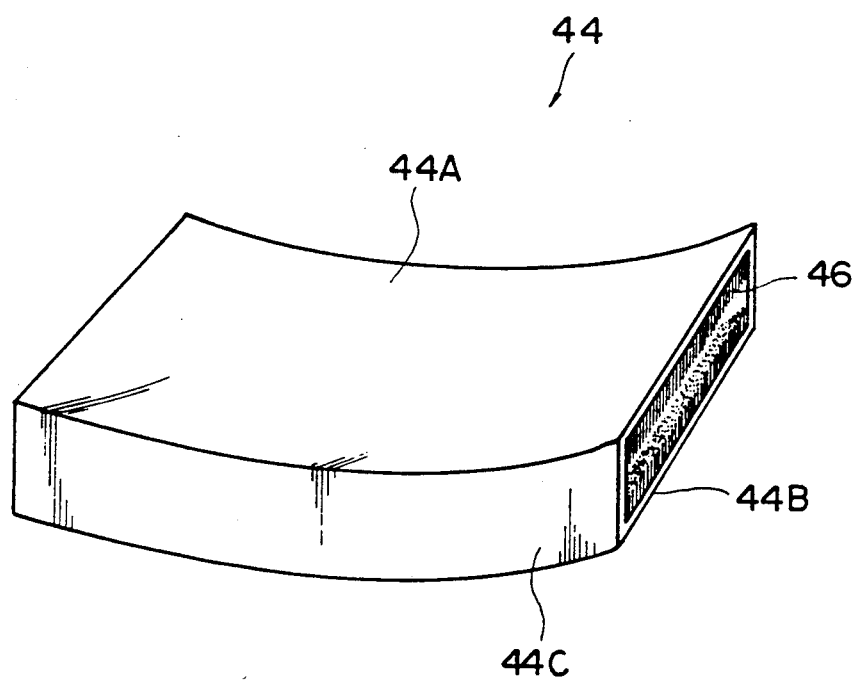
FIG. 3 is a perspective view of a developing compartment for use in the embodiment.

The developing section 14 is provided with a developing compartment 44. As shown in FIG. 3, this developing compartment 44 is provided with an upper wall portion 44A which has a rectangular configuration in plan view and a curved form in side elevation with the middle portion thereof projecting downwards, a lower wall portion 44B opposed to the upper wall portion 44A, and a pair of side wall portions 44C which connect these portions 44A and 44B on opposite sides. The upper wall portion 44A and the lower wall portion 44B define a slit-shaped space through which the PS plate 12 is transported, and the distance between the side wall portions 44C is selected to be greater than the width of the PS plate 12 to be transported. The developer 24 is stored at the bottom of the developing compartment 44.

Brushes 46 are provided over the opposing surfaces of the upper and lower wall portions 44A and 44B, respectively. The brushes 46 are each made from a sheet having raised nap, for example, an artificial-grass sheet. These brushes 46 are disposed so as to rub the upper and lower surfaces of the PS plate 12 which has been fed from the gap between the wire bars 38. In this manner, development of the PS plate 12 is accelerated.

As the PS plate 12, both layers of which have been coated with a predetermined amount of fresh developer, is inserted into the developing compartment 44, the fresh developer is carried into the same through the inlet thereof. In the meantime, aged or deteriorated developer which has been used for development is discharged through the outlet of the developing compartment 44. Accordingly, stable development can be effected. The developer discharged through the outlet of the developing compartment 44 is temporarily stored in a discharged-liquid container 48 which is provided downstream of the developing tank 44 in the developing section 14 as viewed in the direction in which the PS plate 12 is transported.

The PS plate 12, which has been transported to the inlet portion of the developing compartment 44 in the obliquely downward direction, is turned at the middle portion of the developing compartment 44 and is then transported in the obliquely upward direction. Subsequently, the PS plate 12 is transported to the washing section 16 by means of the transport roller pair 28. If necessary, a guide roller for guiding the PS plate 12 may be disposed in the middle portion of the developing compartment 44. Further, the developing compartment 44 may be provided with a heater for controlling the temperature of the developer 24, as required.

The transport roller pair 28 is arranged to be rotated by the driving force of a driving means (not shown).

The bottom of the discharged-liquid container 48 communicates with one end of a line 64. A valve 66 is disposed at an intermediate position on the line 64. When the valve 66 is open, the developer 24 in the discharged-liquid container 48 is discharged into a discharged-liquid tank 45.

The washing section 16 is provided with a washing container 76 which has a substantially V-like configuration in cross section. Two transport roller pairs 68 and 70 are arranged in that order along the transport path for the PS plate 12 above the washing container 76. These transport roller pairs 68 and 70 are rotatably supported between a pair of side boards (not shown), and are arranged to be rotated by the driving force of a driving means (not shown). The PS plate 12 is transported in the approximately horizontal direction by the driving force.

Spray pipes 72 and 74 are disposed between the transport roller pair 68 and the transport roller pair 70. The spray pipe 72 is disposed at a location nearer to the transport roller pair 68 and above the transport path for the PS plate 12, while the spray pipe 74 is disposed at a location nearer to the transport roller pair 70 and below the transport path for the PS plate 12. A plurality of delivery ports (not shown) are formed in each of the spray pipes 72 and 74 along the longitudinal axis thereof. The openings of the delivery ports of the respective spray pipes 72 and 74 are positioned to face the transport path for the PS plate 12.

Each of the spray pipes 72 and 74 communicates with a line 78 one end of which communicates with the bottom of the washing container 76. A washing-water supplying pump 80 is disposed at an intermediate position on the line 78. Washing water 82, which is stored at the bottom of the washing container 76, is supplied to the spray pipes 72 and 74 by the operation of the washing-water supplying pump 80.

One end of a line 84 also communicates with the bottom of the washing container 76. A valve 86 is disposed at an intermediate position on the line 84. When the valve 86 is open, the washing water 82 in the washing container 76 is discharged to a discharged-liquid tank 47. Further, a line 85 is disposed so that water is supplied as required and so that an overflow liquid is discharged into the discharged-liquid tank 47.

The desensitizing section 18 is provided with a desensitizing container 88. A desensitizing liquid is stored at the bottom of this desensitizing container 88.

Two transport roller pairs 90 and 92 are arranged in that order above the desensitizing container 88 in the direction in which the PS plate 12 is transported. These transport rollers 90 and 92 are rotatably supported between a pair of side boards (not shown), and are arranged to be rotated by the driving force of a driving means (not shown). The PS plate 12 which has been fed from the transport roller pair 70 is inserted into the gap between the pair of transport rollers 90, and is then transported in the approximately horizontal direction by the transport roller pair 92.

Spray pipes 94 and 96 are disposed between the transport roller pair 90 and the transport roller pair 92. The spray pipe 94 is disposed at a location nearer to the transport roller pair 90 and above the transport path for the PS plate 12, while the spray pipe 94 is disposed at a location nearer to the transport roller pair 92 and below the transport path for the PS plate 12.

A plurality of delivery ports (not shown) are formed in each of the spray pipes 94 and 96 along the longitudinal axis thereof The openings of the delivery ports of the respective spray pipes 94 and 96 are positioned to face the transport path for the PS plate 12.

Each of the spray pipes 94 and 96 communicates with a line 98 one end of which communicates with the bottom of the desensitizing container 88. A liquid supplying pump 100 is disposed at an intermediate position on the line 98. The desensitizing liquid in the desensitizing container 96 is supplied to the spray pipes 94 and 96 by the operation of the liquid supplying pump 100.

One end of a line 104 communicates with the bottom of the desensitizing container 88. A valve 106 is disposed at an intermediate position on the line 104. When the valve 106 is open, the desensitizing water 102 in the desensitizing container 106 is discharged to a discharged-liquid tank 49. Further, a line 105 is disposed so that the desensitizing liquid is supplied as required and so that an overflow liquid is discharged into the discharged-liquid tank 49.

The operation of the present embodiment is explained below.

The PS plate 12, on both layers of which images have been exposed by the printing apparatus (not shown), is inserted into the gap between the pair of transport rollers 20 and is then fed in the obliquely downward direction.

The developer 24 is supplied through the spray pipes 32 to the upper and lower surfaces of the PS plate 12 which has been fed in the obliquely downward direction Then, the PS plate 12 is retained between the wire bars 38 so that an extra portion of the developer 24 is removed with the amount required for development being left. The thus-removed portion of the developer 24 flows down from the both layers of the PS plate 12, and the developer which has flown down is recovered from the developer metering tank 8 to the developer recovery tank 6 through a discharged-liquid pipe 11. The developer in the developer recovery tank 6 may be returned to the developer tank 1 for the purpose of reuse. In this manner, the upper and lower surfaces of the PS plate 12 are coated with a predetermined amount of developer 24. The PS plate 12 in this state is inserted into the developing compartment 44. Incidentally, since no developer is stored in the developing compartment 44 when the running of the photosensitive-lithographic-plate processor 10 is started, a predetermined amount of developer is accommodated in advance in the developing compartment 44. The upper and lower surfaces of the PS plate 12 which have been inserted in the developing compartment 44 are dipped into the developer stored in the middle portion of the developing compartment 44. In addition, the upper and lower surfaces of the PS plate 12 are rubbed by the corresponding brushes 46, and penetration of the developer into the surface portions is accelerated. In this manner, the upper and lower surfaces of the PS plate 12 are reliably developed.

In such a case, the developer which has been supplied to the PS plate 12 is carried into the developing compartment 44 as the PS plate 12 is transported into the same. After the developer is stored in the middle portion of the developing compartment 44, it overflows from the downstream end portion of the developing compartment 44 in the direction in which the PS plate 12 is transported, and is then discharged into the discharged-liquid container 48. As described above, since the developer in the developing compartment 44 is replenished with the developer carried by the PS plate 12, it is not necessary to separately provide a device for replenishing the developing compartment 44 with a fresh developer.

The PS plate 12 which has been fed out of the developing compartment 44 is transported to the transport roller pair 28, and the developer is squeezed from the PS plate 12 by the transport roller pair 28. As in the case of the overflow from the developing compartment 44, the squeezed developer is temporarily stored in the discharged-liquid container 48.

After the upper and lower surfaces of the PS plate 12 have been coated with the developer and have been developed, the PS plate 12 is transported to the washing section 16 by means of the transport roller pair 28. The PS plate 12 which has been fed from the transport roller pair 28 is inserted into the gap between the pair of transport rollers 68. The PS plate 12 which has been inserted between the pair of transport rollers 68 is transported in the approximately horizontal direction and is then inserted into the gap between the pair of transport rollers 70. During this transport, the upper and lower surfaces of the PS plate 12 are washed with washing water supplied from the spray pipes 72 and 74. The PS plate 12 which has been washed is inserted into the gap between the pair of transport rollers 90, fed into the gap between the pair of transport rollers 92, and transported in the approximately horizontal direction above the desensitizing section 18. During this transport, the upper and lower surfaces of the PS plate 12 are coated with the desensitizing liquid from the spray pipes 94 and 96. The PS plate 12 which has been coated with the desensitizing liquid is fed out of the photosensitive-lithographic-plate processor 10 by means of the transport roller pair 92, and is then transported into a drying device (not shown).

As described above, in accordance with the present invention, there are provided an improved method of developing a photosensitive lithographic plate on which an image has been exposed and an improved apparatus for carrying out the improved method. In each of the method and the apparatus, while the photosensitive lithographic plate is being transported in the approximately horizontal direction, it is coated with a predetermined amount of developer which is substantially fresh. Thereafter, the photosensitive lithographic plate which has been coated with the developer is transported in the obliquely downward direction and dipped into the developer. In the developer, the upper and lower surfaces of the photosensitive lithographic plate are rubbed with a rubbing means so that the photosensitive lithographic plate is developed. Accordingly, the prevent invention can provide the excellent advantage that it is possible to reliably develop the upper and lower surfaces of the photosensitive lithographic plate with the minimum required amount of developer.

What is claimed is:

1. An apparatus for developing a photosensitive lithographic plate on which images have been exposed while transporting said photosensitive lithographic plate with one surface thereof facing roughly downwards, comprising;
   coating means, in fluid communication with a supply of fresh developer, for coating light sensitive layers of said photosensitive lithographic plate which is being transported with fresh developer;
   a developing section which accommodates developing fluid in which said photosensitive lithographic plate coated with said fresh developer is to be dipped as said photosensitive lithographic plate is curved to project downwards, said developing section being arranged such that said fresh developer applied to said photosensitive lithographic plate is carried into said developing section to replenish said developing fluid in said developing section with said fresh developer applied to said photosensitive lithographic plate; and
   rubbing means disposed in said developing section for accelerating development by rubbing said light sensitive layers of said photosensitive lithographic plate.

2. An apparatus for developing a photosensitive lithographic plate according to claim 1, further including removing means for removing said fresh developer applied to said light sensitive layers until a predetermined amount is reached.

3. An apparatus for developing a photosensitive lithographic plate according to claim 2, wherein said removing means comprises a wire bar including a shaft and a wire spirally wound around the outer periphery of said shaft, said wire being positioned in contact with said light sensitive layers of said photosensitive lithographic plate.

4. An apparatus for developing a photosensitive lithographic plate according to claim 1, wherein said developing section comprises an upper plate-like portion and a lower plate-like portion, said portions being curved downwardly and being arranged in a vertically spaced manner such that one surface of said upper plate-like portion opposes one surface of said lower plate-like portion, said photosensitive lithographic plate being dipped in said developing fluid while being transported in the gap between said upper plate-like portion and said lower plate-like portion.

5. An apparatus for developing a photosensitive lithographic plate according to claim 4, wherein the positional relationship between said upper plate-like portion and said lower plate-like portion is established to define a predetermined form of slit therebetween in cross-sectional view.

6. An apparatus for developing a photosensitive lithographic plate according to claim 5, wherein said rubbing means includes a brush provided on each of the opposing surfaces of said upper plate-like portion and said lower plate-like portion.

7. An apparatus for developing a photosensitive lithographic plate according to claim 6, wherein each said brush is made from a sheet having raised nap.

8. An apparatus for developing a photosensitive lithographic plate according to claim 6, further comprising delivery means including spray means for spraying said fresh developer on said photosensitive lithographic plate at predetermined intervals over the width thereof while said photosensitive lithographic plate is being transported.

9. An apparatus for developing a photosensitive lithographic plate according to claim 1, further including removing means for removing said fresh developer applied to said light sensitive layers so that a predetermined amount is kept on said light sensitive layers.

10. An apparatus for developing a photosensitive lithographic plate according to claim 1, wherein said developing section comprises an upper plate-like portion and a lower plate-like portion, substantially intermediate sections of said portions being curved downwardly and being arranged in a vertically spaced manner such that one surface of said upper plate-like portion opposes one surface of said lower plate-like portion and said photosensitive lithographic plate is dipped in said developing fluid while being transported in the gap between said upper plate-like portion and said lower plate-like portion.

11. An apparatus for developing a photosensitive lithographic plate, on both light sensitive layers of which images have been exposed while transporting said photosensitive lithographic plate with one layer thereof facing roughly downwards, comprising:
   (a) coating means, in fluid communication with a supply of fresh developer, for coating both layers of said photosensitive lithographic plate which is being transported with fresh developer;
   (b) a developing compartment curved in a downwardly projecting manner and provided with a transport path which accommodates developing fluid, said photosensitive lithographic plate coated with said fresh developer being guided along curved surfaces which define said transport path to be dipped into said accommodated developing fluid, and said fresh developer applied to said photosensitive lithographic plate by said coating means being carried into said transport path to effect replenishment of said accommodated developing fluid; and
   (c) a rubbing member disposed in said transport path for keeping in touch with said both layers of said photosensitive lithographic plate.

12. An apparatus for developing a photosensitive lithographic plate according to claim 11, further comprising removing, means for removing said fresh developer, which has been applied to said light sensitive layers by said coating means, until a predetermined amount is reached.

13. An apparatus for developing a photosensitive lithographic plate according to claim 12, wherein said removing means comprises a wire bar including a shaft and a wire spirally wound around the outer periphery of said shaft, said wire being positioned in contact with light sensitive layers of said photosensitive lithographic plate.

14. An apparatus for developing a photosensitive lithographic plate according to claim 11, wherein said transport path is defined by a pair of opposing walls which is curved in a downward projecting manner, said opposing walls being arranged in a vertically spaced manner such that one surface of either of said walls opposes one surface of the other.

15. An apparatus for developing a photosensitive lithographic plate according to claim 14, wherein said rubbing member is a brush provided on each of the opposing surfaces of said pair of opposing walls.

16. An apparatus for developing a photosensitive lithographic plate according to claim 15, wherein each said brush is made from a sheet having raised nap.

17. An apparatus for developing a photosensitive lithographic plate according to claim 11, further comprising removing means for removing said fresh developer, which has been applied to said light sensitive layers by said coating means, so that a predetermined amount is kept on said light sensitive layers.

18. An apparatus for developing a photosensitive lithographic plate according to claim 11, wherein said transport path is defined by a pair of opposing walls whose substantial intermediate sections are curved in a downward projecting manner, said opposing walls being arranged in a vertically spaced manner such that one surface of either of said walls opposes one surface of the other.

* * * * *